(12) United States Patent  (10) Patent No.: US 7,919,917 B2
Chen et al.  (45) Date of Patent: Apr. 5, 2011

(54) REFLECTIVE LIQUID CRYSTAL DISPLAY, TOP-EMITTING OLED DISPLAY AND FABRICATION METHOD THEREOF

(75) Inventors: Liang-Hsiang Chen, Taichung (TW); Jing-Yi Yan, Taoyuan (TW); Jia-Chong Ho, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 67 days.

(21) Appl. No.: 12/358,098

(22) Filed: Jan. 22, 2009

(65) Prior Publication Data
US 2009/0195150 A1  Aug. 6, 2009

(30) Foreign Application Priority Data
Jan. 31, 2008  (TW) ............... 97103678 A

(51) Int. Cl.
*H01J 1/62* (2006.01)
(52) U.S. Cl. ........ 313/504; 313/506
(58) Field of Classification Search .......... 313/504, 313/506
See application file for complete search history.

(56) References Cited

U.S. PATENT DOCUMENTS

| 4,211,822 A | | 7/1980 | Kurfman et al. |
| 4,241,129 A | | 12/1980 | Marton et al. |
| 4,257,536 A | | 3/1981 | Hilmar |
| 4,749,625 A | | 6/1988 | Obayashi et al. |
| 5,158,831 A | | 10/1992 | Schirmer |
| 5,530,269 A | * | 6/1996 | Tang ................. 257/88 |
| 6,586,876 B2 | * | 7/2003 | Tsai et al. ........ 313/509 |
| 6,720,203 B2 | * | 4/2004 | Carcia et al. ........ 438/99 |
| 6,777,871 B2 | * | 8/2004 | Duggal et al. ........ 313/506 |
| 6,994,906 B2 | * | 2/2006 | Burroughes et al. ....... 428/332 |

* cited by examiner

*Primary Examiner* — Vip Patel

(57) ABSTRACT

A top-emitting OLED display and fabrication method thereof are provided. The top-emitting OLED display includes providing a handling substrate. A composite layer is formed on the handling substrate. An organic light emitting unit is formed on the composite layer. A top electrode is formed on the organic light emitting unit. A reflective type display and fabrication method thereof are provided. The reflective type display includes providing a handling substrate. A composite layer is formed on the handling substrate, a thin film transistor array is formed on the composite layer.

7 Claims, 4 Drawing Sheets

REFLECTIVE LIQUID CRYSTAL DISPLAY, TOP-EMITTING OLED DISPLAY AND FABRICATION METHOD THEREOF

BACKGROUND OF THE INVENTION

1. Field of the Invention

The present invention relates to a top-emitting OLED display, and more particularly relates to a reflective type display and fabrication method thereof. The present invention also relates to a reflective type display, and more particularly relates to a reflective type display and fabrication method thereof.

2. Description of the Related Art

There are many advantages of a flexible display such as having strong impact resistance, a lighter weight and flexibility. In addition, flexible displays have the potential for application in new emerging products such as electronic paper, electronic tagging machines, credit cards, roll-up displays, and electronic billboards, in addition to portable electronic devices. Therefore, applications and technological advancements for flexible displays have seen increased research and development recently. In general, flexible substrate materials are classified into two categories: plastic substrates of mainly organic materials; and metal foil of mainly inorganic materials. Some advantageous for plastic substrates such as polycarbonate (PC), polyethersulfone (PES), polyarylate (PAR), polyimide (PI), polyethylene terephathalate (PET) or polyetherimide (PEI), are that they have high transparency and a relatively high external force distortion tolerance (e.g., may withstand multiple distortions).

However, one disadvantage of plastic substrates is that water vapor is more easily absorbed by the plastic substrates. Generally, the water vapor barrier rate of plastic substrates is between 101 g/m$^2$/day and 100 g/m$^2$/day. On the other hand, the water vapor barrier rate of TFT-LCDs and OLEDs are respectively 10$^{-4}$ g/m$^2$/day and under 10$^{-4}$ g/m$^2$/day. Thus, if the plastic substrates are used, the operating lifespan of displays or products using the plastic substrates will decrease.

As for metal foil substrates, some advantageous are that water vapor is not easily absorbed by the metal foil substrate and the metal foil substrate has flexibility. However, one disadvantage of metal foil substrates is that metal foil substrates have a relatively low external force distortion tolerance (e.g., unable to withstand multiple distortions).

Therefore, a new method for fabricating a flexible display is called for to alleviate the above constraints.

BRIEF SUMMARY OF THE INVENTION

A detailed description is given in the following embodiments with reference to the accompanying drawings.

An embodiment of the invention discloses a method for forming a top-emitting organic light emitting display, comprising: providing a handling substrate; providing a composite layer on the handling substrate; forming an organic light emitting unit on the composite layer; and forming a top electrode on the organic light emitting unit.

Another embodiment of the invention discloses a method for forming a reflective type liquid crystal display, comprising: providing a handling substrate; forming a first layer on the handling substrate; forming a metal layer on the first layer; forming a second layer on the metal layer; and forming a thin film transistor array on the second layer.

A further embodiment of the invention provides a top-emitting organic light emitting display, comprising: a composite layer; an organic light emitting unit formed on the composite layer; and a top electrode formed on the organic light emitting unit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
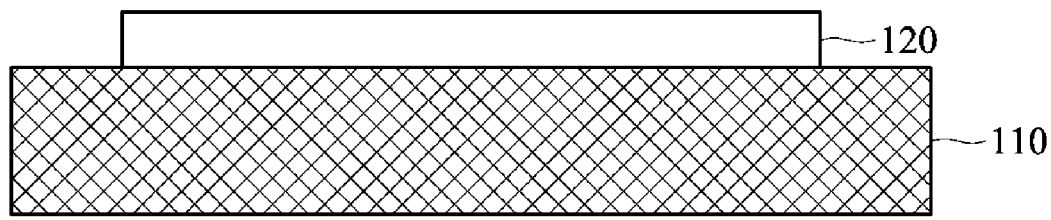
FIG. 1A to FIG. 1E are cross sections of a method for forming a top-emitting organic light emitting display according to an embodiment of the invention, illustrating fabrication steps thereof.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1A to 1E show cross sections of an exemplary embodiment of a process for fabricating a top-emitting organic light emitting display 200. Wherever possible, the same reference numbers are used in the drawings and the descriptions to refer to the same or like parts.

Referring to FIG. 1A, a handling substrate 110 is provided and a selective cleaning process is performed for removing pollutants of the handling substrate 110. The handling substrate 110 can be hard materials such as glass, quartz, ceramic or silicon wafer. Then a composite layer is formed on the handling substrate 110, which may include forming a first layer covering the handling substrate 110, forming a second layer covering the first layer, and forming a metal layer between the first layer and the second layer. In an embodiment of the invention, a first layer 120 is formed on the handling substrate 110 as a lower substrate of a display. The first layer 120 comprises several polymer materials such as polycarbonate (PC), polyethersulfone (PES), polyarylate (PAR), polyimide (PI), polyethylene terephathalate (PET) or polyetherimide (PEI). In one embodiment of the invention, the first layer 120 can be formed by coating processes such as a die coating or table coating process and the like. After coating, the first layer 120 is heated for solidification on the handling substrate 110.

Figure 1B:
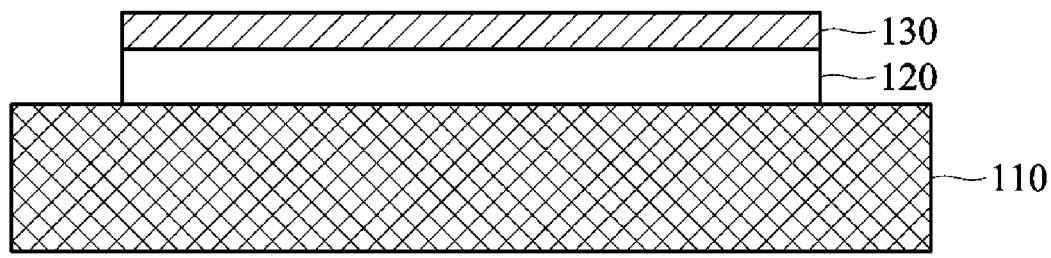

As FIG. 1B shows, a metal layer 130 can be formed on the first layer 120 by an electroless deposition process. In another embodiment of the invention, the metal layer 130, as a metal foil can be attached to the first layer 120 by a hot embossing process, wherein the metal layer 130 serves as a lower electrode of the display. Note that the metal layer 130 can also be a reflective layer for reflecting any light impinging thereon. The metal layer 130 may include platinum (Pt), palladium (Pd), iridium (Ir), gold (Au), tungsten (W), nickel (Ni), silver (Ag) or aluminum (Al).

Figure 1C:
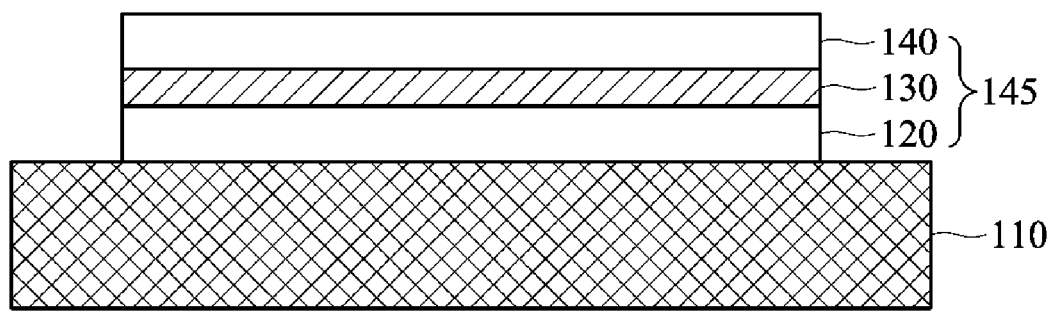

Referring to FIG. 1C, a second layer 140 is formed on the metal layer 130 as a passivation layer of the metal layer 130. The second layer 140 and the first layer 120 can be formed of substantially the same materials and processes. However, the second layer 140 may be made of a polymer material which differs from a polymer material of the first layer 120. Thus, the first layer 120, the metal layer 130 and the second layer 140 constitute a composite layer 145. Preferably, the thickness of the metal layer 130 is from 0.1 times to 0.5 times the thickness of the first layer 120 or the second layer 140. Meanwhile, the thickness of the first layer 120 and of the second layer 140 can be the same or different.

Figure 1D:
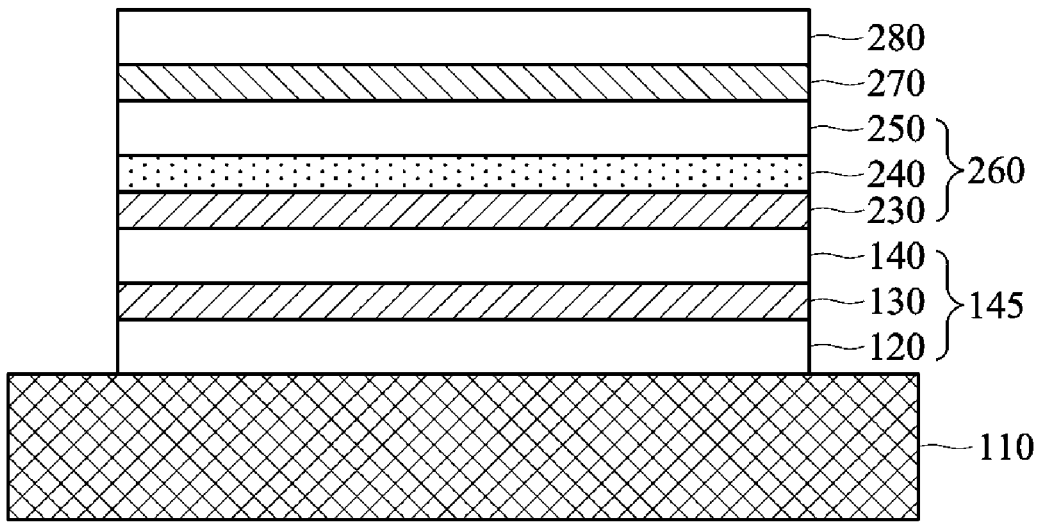

Referring to FIG. 1D, an organic light emitting unit 260 is formed on the composite layer 145. The organic light emitting unit 260 can comprise a hole injection layer 230, an organic light emitting layer 240 and an electron injection layer 250. Following is the manufacturing method for the organic light emitting unit 260. Firstly, the electron injection layer 230 and the organic light emitting layer 240 are sequentially formed on the composite layer 145. The electron injection layer 230 and the organic light emitting layer 240 can be formed by a process such as a vacuum evaporation process. The material of the electron injection layer 230 can be such as an m-MTDATA (4,4',4"-tri{N-3-methylphenyl-N-phenyl-amino)-triphenylamine) and the organic light emitting layer 240 can be formed by a process such as a vacuum evaporation process. The material of the organic light emitting layer 240 may be a doped organic material. Then, the electron injection layer 250 is formed on the organic light emitting layer 240 by a process such as a vacuum evaporation process. The material of the electron injection layer 250 may be formed of metal halide. Following, a top electrode 270 such as a metal layer can be blanketly formed on the electron injection layer 250 by processes such as a vacuum evaporation or sputtering process and the metal layer is patterned by processes such as a photolithography and etching process. The metal layer may include materials such as aluminum (Al), gold (Au) or platinum (Pt). Finally, a transparent plastic substrate 280 is formed on the top electrode 270 as an upper substrate of the display.

Figure 1E:
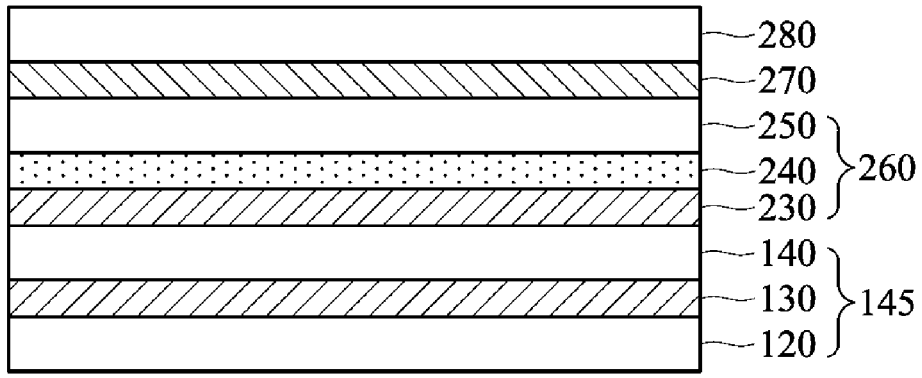
Figure 1E:
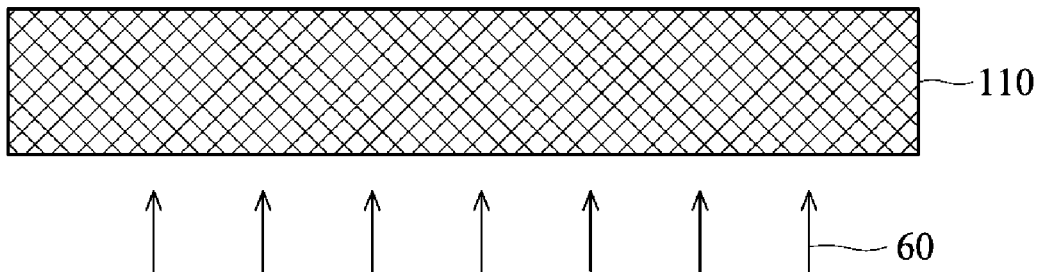

As FIG. 1E shows, the lower surface of the handling substrate 110 which comprises the composite layer 145, the organic light emitting unit 260, the top electrode 270 and the transparent plastic substrate 280 is irradiated by a laser beam 60 to separate the first layer 120 from the handling substrate 110. Since the first layer 120 comprised of polymer materials is formed on the handling substrate 110, a substantial non-contact interface may be formed between the first layer 120 and the handling substrate 110. Therefore, when the lower surface of the handling substrate 110 is irradiated by the laser beam 60, an internal stress is produced between the first layer 120 and the handling substrate 110, wherein the first layer 120 peels off from the handling substrate 110. Thus, the composite layer 145, the organic light emitting unit 260, the top electrode 270 and the transparent plastic substrate 280 constitute a flexible organic light emitting display 200.

It is noted that since the bottom electrode 130 of the flexible organic light emitting display 200 is disposed between the first layer 120 and the second layer 140, the bottom electrode 130 can be protected by both the first layer 120 and the second layer 140. For example, the second layer 140 can prevent possible damage of the bottom electrode 130 during subsequent processes. In addition, the bottom electrode 130 is comprised of metal materials which can prevent water vapor from entering the organic light emitting unit 260 for increasing the operating lifespan of the flexible organic light emitting display 200. Additionally, since the upper and lower substrates (i.e. the first layer 120 and the transparent plastic substrate 280) of the flexible organic light emitting display 200 are formed by polymers, possible damage caused by external forces to the flexible organic light emitting display 200 comprised of a metal foil substrate and problems normally associated with metal foil substrates such as having a relatively low external force distortion tolerance (e.g., unable to withstand multiple distortions) are prevented.

Additionally, the composite layer 145 can be applied to any product which can use a flexible substrate with an installed metal layer as a foundation on the flexible substrate. In the aforementioned embodiments, although the descriptions only use the flexible organic light emitting display, the invention is not limited thereto. For instance, the composite layer 145 of the embodiment of the invention can be applied to a flexible electronic device such as a Radio Frequency Identification (RFID) and a flexible display device such as an electrophoretic display (EPD) or a field emission display (FED), and are also not limited thereto.

Referring to FIG. 2, an embodiment of the invention for fabricating a reflective type liquid crystal display is shown.

Figure 2A:
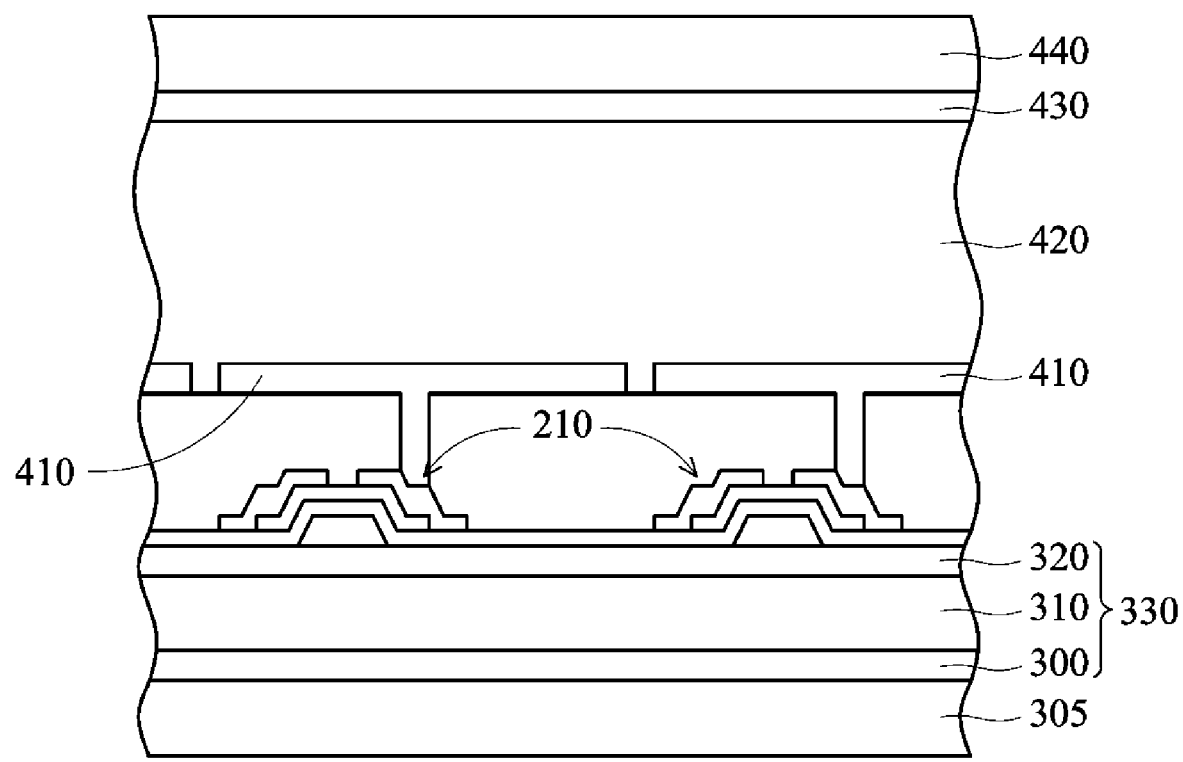
FIG. 2A to FIG. 2B are cross sections of a method for forming a reflective type liquid crystal display according to an embodiment of the invention, illustrating fabrication steps thereof.

As FIG. 2A shows, a handling substrate 305 is provided and a composite layer 330 is formed on the handling substrate 305. The materials and methods for forming the handling substrate 305 and the composite layer 330 are the same as the materials and methods for forming the handling substrate 110 and the composite layer 145 in the embodiments of FIG. 1A to FIG. 1E. Similarly, the composite layer 330 includes a first layer 300 covering the handling substrate 305, a second layer 320 covering the first layer 300 and a metal layer 310 between the first layer 300 and the second layer 320. Next, a thin film transistor (TFT) array 210 is formed on the second layer 320. The TFT array 210 can be a bottom gate type or a top gate type. Although the bottom gate type is used as illustration, the invention is not intended to be limited thereto.

Referring to FIG. 2A again, a plurality of transparent pixel electrodes 410 are formed to connect to the TFT array 210. The transparent pixel electrodes 410 may be an indium tin oxide (ITO) electrode. Following, a transparent plastic substrate 440 is provided as an upper substrate and the transparent plastic substrate 440 is disposed on opposite sides of the handling substrate 305. Next, a common electrode 430 such as an ITO electrode is formed on the inside transparent plastic substrate 440. Then, a display layer 420 such as a liquid crystal layer is filled between the handling substrate 305 and the transparent plastic substrate 440. It is noted that the display material of the display layer 420 can be changed appropriately. For example, the display material such as a micro capsule having electrophoretic characteristics also can be used as the display material of the display layer 420.

Figure 2B:
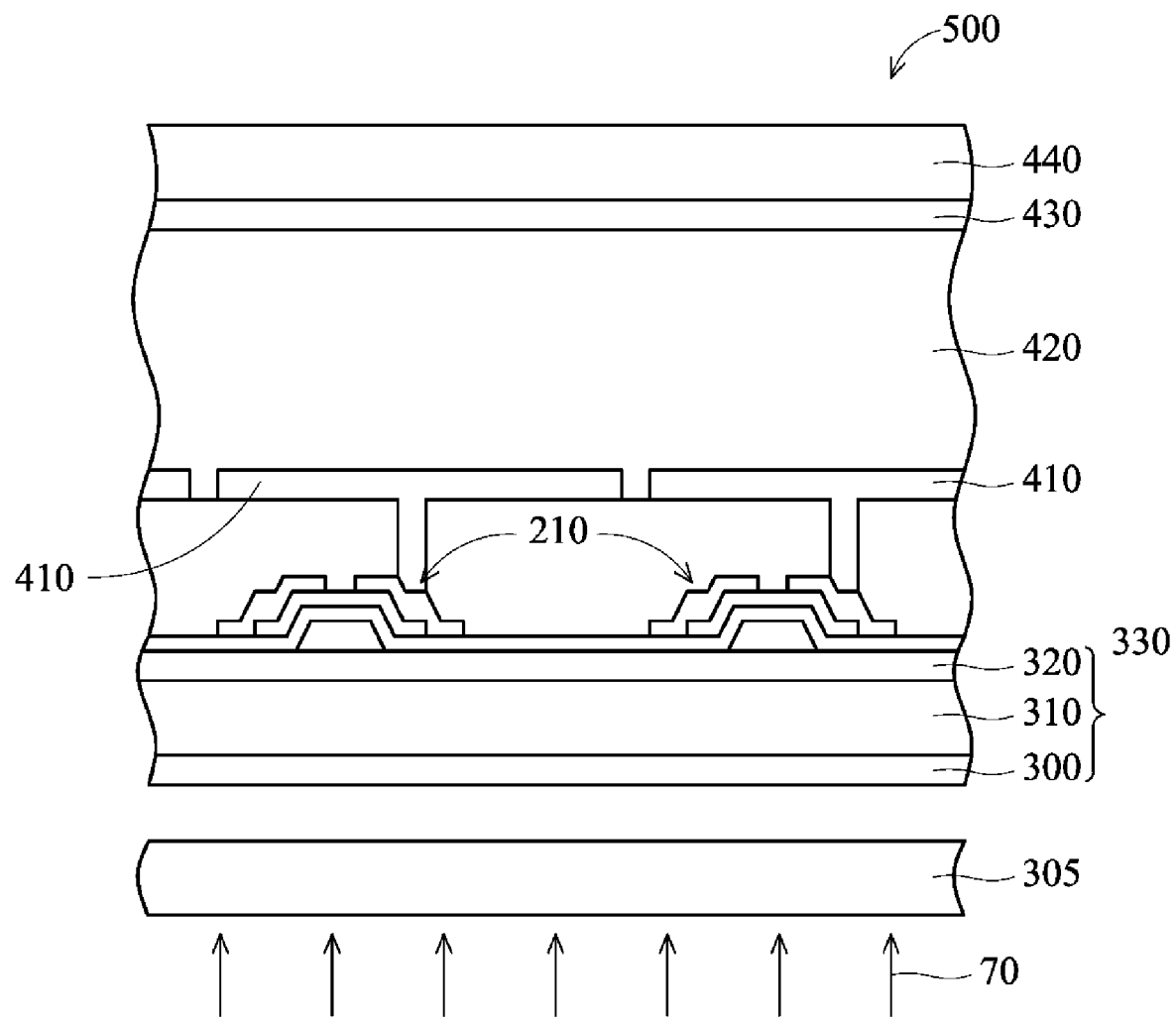

As FIG. 2B shows, the lower surface of the handling substrate 305 which comprise the composite layer 330 and the elements of the reflective liquid crystal display is irradiated by a laser beam 70 to separate the first layer 300 from the handling substrate 305. Consequently, the composite layer 330, the TFT array 210, the pixel electrode 410, the display layer 420, the common electrode 430 and the transparent plastic substrate 440 constitute a flexible reflective liquid crystal display 500.

In this embodiment of the invention, since the metal layer 310 of the flexible reflective liquid crystal display 500 can prevent water vapor from entering the display layer 420, the operating lifespan of the flexible reflective liquid crystal display 500 is increased when compared to a conventional flexible reflective liquid crystal display without the metal layer 310.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A top-emitting organic light emitting display, comprising:
    a composite layer comprising:
        a first layer;
        a second layer disposed on the first layer; and
        a metal layer disposed between the first layer and the second layer;
    an organic light emitting unit formed on the composite layer; and
    a top electrode formed on the organic light emitting unit.

2. The top-emitting organic light emitting display as claimed in claim 1, further comprising a transparent plastic substrate disposed on the top electrode.

3. The top-emitting organic light emitting display as claimed in claim 1, wherein the first layer and the second layer are formed by a coating process.

4. The top-emitting organic light emitting display as claimed in claim 3, wherein the first layer or the second layer comprise polycarbonate (PC), polyethersulfone (PES), polyarylate (PAR), polyimide (PI), polyethylene terephathalate (PET) or polyetherimide (PEI).

5. The top-emitting organic light emitting display as claimed in claim 1, wherein the thickness of the metal layer is from 0.1 times to 0.5 times the thickness of the first layer or the second layer.

6. The top-emitting organic light emitting display as claimed in claim 1, wherein the metal layer comprises gold (Au), aluminum (Al), silver (Ag) or copper (Cu).

7. The top-emitting organic light emitting display as claimed in claim 6, wherein the metal layer is formed by a hot embossing or electroless deposition process.

* * * * *